United States Patent
Yang et al.

(10) Patent No.: US 10,164,614 B2
(45) Date of Patent: Dec. 25, 2018

(54) TANK CIRCUIT AND FREQUENCY HOPPING FOR ISOLATORS

(71) Applicant: Analog Devices Global Unlimited Company, Hamilton (BM)

(72) Inventors: Xin Yang, Beijing (CN); Tianting Zhao, Beijing (CN); Baoxing Chen, Westford, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/087,723

(22) Filed: Mar. 31, 2016

(65) Prior Publication Data

US 2017/0288650 A1 Oct. 5, 2017

(51) Int. Cl.
H03B 5/12 (2006.01)
H03K 3/013 (2006.01)
H03B 5/08 (2006.01)

(52) U.S. Cl.
CPC .............. *H03K 3/013* (2013.01); *H03B 5/08* (2013.01); *H03B 5/12* (2013.01); *H03B 5/1228* (2013.01); *H03B 5/1231* (2013.01); *H03B 5/1253* (2013.01); *H03B 5/1265* (2013.01); *H03B 5/1296* (2013.01)

(58) Field of Classification Search
CPC ...... H03B 5/12; H03B 5/1253; H03B 5/1231; H03B 5/1296; H03B 5/08; H03K 3/013
USPC ............................... 331/167, 117 FE, 49, 175
See application file for complete search history.

(56) References Cited

U.S. PATENT DOCUMENTS

| 4,904,889 | A  | 2/1990  | Chieli         |
|-----------|----|---------|----------------|
| 4,980,576 | A  | 12/1990 | Rossi et al.   |
| 5,095,357 | A  | 3/1992  | Andoh et al.   |
| 5,990,753 | A  | 11/1999 | Danstrom et al.|
| 6,658,748 | B1 | 12/2003 | Leipold et al. |
| 6,900,699 | B1 | 5/2005  | Kim            |
| 7,940,830 | B2 | 5/2011  | Marsili et al. |
| 8,364,195 | B2 | 1/2013  | Spina et al.   |

(Continued)

FOREIGN PATENT DOCUMENTS

| CN | 101944526 A | 1/2011 |
| EP | 1 195 000 B1 | 4/2002 |

(Continued)

OTHER PUBLICATIONS

R. C. H. van de Beek, D. M. W. Leenaerts, and G. van der Weide, "A Fast-Hopping Single-PLL 3-Band MB-OFDM UWB Synthesizer," in IEEE Journal of Solid-State Circuits, vol. 41, No. 7, pp. 1522-1529, Jul. 2006.

(Continued)

*Primary Examiner* — Arnold Kinkead
(74) *Attorney, Agent, or Firm* — Wolf, Greenfield & Sacks, P.C.

(57) ABSTRACT

Embodiments of the present disclosure may provide a circuit comprising a tank circuit. The tank circuit may include an inductor having a pair of terminals, a first pair of transistors, and a first pair of capacitors. Each transistor may be coupled between a respective terminal of the inductor and a reference voltage along a source-to-drain path of the transistor. Each capacitor may be provided in a signal path between an inductor terminal coupled to a respective first transistor in the first pair and a gate of a second transistor in the first pair.

19 Claims, 5 Drawing Sheets

(56) References Cited

U.S. PATENT DOCUMENTS

| | | |
|---|---|---|
| 8,428,539 B2 | 4/2013 | Dupuis |
| 8,629,714 B2 | 1/2014 | Ng et al. |
| 8,809,951 B2 | 8/2014 | Lin et al. |
| 9,380,705 B2 | 6/2016 | Chen |
| 2003/0107905 A1 | 6/2003 | Miura et al. |
| 2008/0174378 A1 | 7/2008 | Cusmai et al. |
| 2009/0067116 A1 | 3/2009 | Fujii et al. |
| 2009/0243783 A1 | 10/2009 | Fouquet et al. |
| 2009/0289732 A1* | 11/2009 | Miyashita ............ H03B 5/1228 331/117 FE |
| 2010/0295627 A1* | 11/2010 | Okada ................ H03B 5/1228 331/117 FE |
| 2011/0291819 A1 | 12/2011 | Kaeriyama |
| 2013/0001735 A1 | 1/2013 | Hopper et al. |
| 2013/0063219 A1* | 3/2013 | Shanan ................ H03B 1/04 331/117 FE |
| 2014/0167218 A1 | 6/2014 | Mallikarjunaswamy et al. |
| 2014/0262464 A1 | 9/2014 | Chen |

FOREIGN PATENT DOCUMENTS

| | | |
|---|---|---|
| EP | 1195000 B1 | 1/2003 |
| EP | 14157273.5 | 10/2014 |
| WO | WO 00/76057 A1 | 12/2000 |

OTHER PUBLICATIONS

S. S. Rai and B. P. Otis, "A 600 μW BAW-Tuned Quadrature VCO Using Source Degenerated Coupling," in IEEE Journal of Solid-State Circuits, vol. 43, No. 1, pp. 300-305, Jan. 2008.

Extended European Search Report dated Oct. 15, 2014 in connection with European Application No. 14157273.5.

Chinese Office Action dated Jan. 10, 2017 in connection with Chinese Application No. 201410093861.9 and English translation thereof.

Chinese Office Action dated Jul. 31, 2017 in connection with Chinese Application No. 201410093861.9 and English translation thereof.

* cited by examiner

200

300

400

TANK CIRCUIT AND FREQUENCY HOPPING FOR ISOLATORS

BACKGROUND

The present disclosure generally relates to circuits for transmitting power across an isolation barrier and applying frequency hopping for power transmission.

Some integrated circuits include two or more voltage domains that are galvanically isolated from one another. In such integrated circuits, it may be desirable to transmit power from one domain to another. Existing circuits to transmit power from one domain to another, while maintaining galvanic isolation, suffer from a variety of drawbacks. For example, some conventional tank circuits use cross-coupled metal oxide semiconductor (MOS) transistors, which lead to poor efficiency and poor electromagnetic interference (EMI) performance.

Therefore, the inventors recognized a need in the art for circuits and methods to efficiently transmit power between galvanically-isolated domains and improve EMI performance.

DETAILED DESCRIPTION

Embodiments of the present disclosure may provide a circuit comprising a tank circuit. The tank circuit may include an inductor having a pair of terminals, a first pair of transistors, and a first pair of capacitors. Each transistor may be coupled between a respective terminal of the inductor and a reference voltage along a source-to-drain path of the transistor. Each capacitor may be provided in a signal path between an inductor terminal coupled to a respective first transistor in the first pair and a gate of a second transistor in the first pair.

Embodiments of the present disclosure may provide controller method for generating an oscillation frequency. The method may include at a first time instance: activating a first pair of transistors of the tank circuit, each coupled between a respective terminal of an inductor having a pair of terminals and a reference voltage along a source-to-drain path of the transistor; coupling, as a result of the activating, a first of a pair of capacitors of the tank circuit provided in a signal path between a source or drain terminal of a first transistor in the first pair and a gate of a second transistor in the first pair; and coupling, as a result of the activating, a second of the pair of capacitors provided in a signal path between a source or drain terminal of the second transistor in the first pair and a gate of the first transistor in the first pair, wherein a voltage having an oscillation frequency is generated at the terminals of the inductor to transmit power over an isolation barrier.

Embodiments of the present disclosure may provide a circuit. The circuit may include a means for activating a first pair of transistors of an inductor-capacitor (LC) tank at a first time instance, each transistor coupled between a respective terminal of an inductor having a pair of terminals and a reference voltage along a source-to-drain path of the transistor. The circuit may also include a first means for coupling, as a result of the activating, a first of a pair of capacitors of the tank circuit provided in a signal path between a source or drain terminal of a first transistor in the first pair and a gate of a second transistor in the first pair. The circuit may further include a second means coupling, as a result of the activating, a second of the pair of capacitors provided in a signal path between a source or drain terminal of the other transistor in the first pair and a gate of the first transistor in the first pair, wherein a voltage having the oscillation frequency is generated at the terminals of the inductor to transmit power over an isolation barrier.

Figure 1:
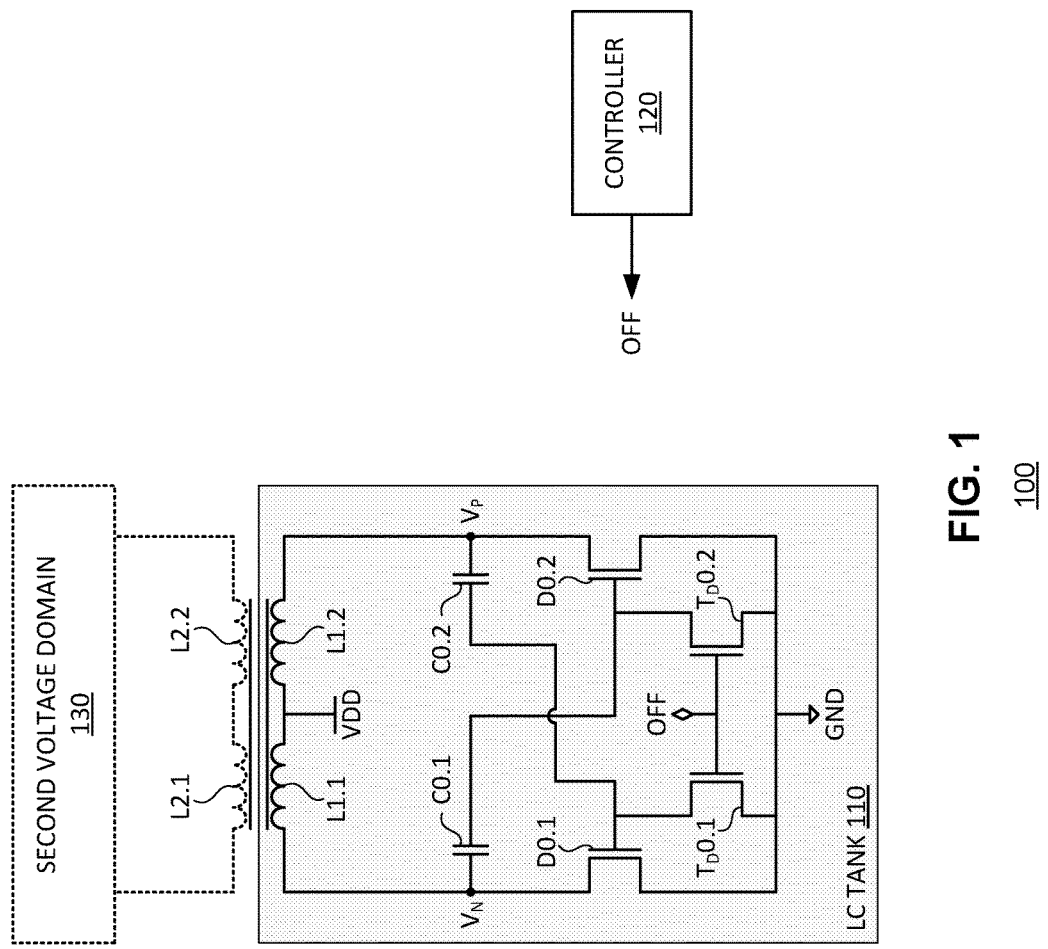
FIG. 1 illustrates an oscillator circuit according to an embodiment of the present disclosure.

FIG. 1 illustrates an oscillator circuit 100 according to an embodiment of the present disclosure. The oscillator circuit 100 may include an LC tank 110 controlled by a controller 120. The LC tank 110 may include a pair of inductors L1.1, L1.2, a pair of capacitors C0.1, C0.2, a pair of double-diffused metal oxide semiconductor (DMOS) transistors D0.1, D0.2, and a pair of disabling transistors $T_D0.1$, $T_D0.2$.

The pair of inductors L1.1, L1.2 may be coupled in series to form a center tap and a pair of terminals ($V_N$, $V_P$). The center tap may be coupled to a power source VDD. The pair of DMOS transistors D0.1, D0.2 may each be coupled, along a respective source-to-drain path, between a respective terminal of the pair of inductors L1.1, L1.2 and a reference voltage GND. The capacitor C0.1 may be provided in a signal path between the inductor L1.1 coupled to DMOS transistor D0.1 and a gate of the DMOS transistor D0.2. Similarly, the capacitor C0.2 may be provided in a signal path between the inductor L1.2 coupled to DMOS transistor D0.2 and a gate of the DMOS transistor D0.1. The pair of disabling transistors $T_D0.1$, $T_D0.2$ may have their gates coupled to a control input (OFF) (logic high) and may be coupled, along their respective source-to-drain paths, between the gates of the DMOS transistors D0.1, D0.2, respectively, and the reference voltage GND. The disabling transistors $T_D0.1$, $T_D0.2$ may be implemented as any known transistor type (e.g., MOS, FET, BJT, DMOS, etc.).

The controller 120 may provide a control signal OFF (logic high) to the gates of the disabling transistors $T_D0.1$, $T_D0.2$ to activate the disabling transistors T0.1, T0.2. When activated, the disabling transistors $T_D0.1$, $T_D0.2$ may pull the gates of the DMOS transistors D0.1, D0.2 low, thereby turning off the DMOS transistors D0.1, D0.2 and disabling the LC tank 210. When the disabling transistors $T_D0.1$, $T_D0.2$ are deactivated (i.e., no OFF signal), the DMOS transistors D0.1, D0.2 may be activated, coupling the capacitors C0.1, C0.2 to the inductors L1.1, L1.2, respectively. Consequently, the LC tank 110 may resonate or oscillate at a resonance or oscillation frequency fosc and transmit power from the power source VDD to a second voltage domain 130 via a pair of inductors L2.1, L2.2. An isolation barrier may be provided in between inductors L1.1, L1.2 and inductors L2.1, L2.2; therefore, the inductors L2.1, L2.2 may be magnetically coupled to, but galvanically isolated from, the inductors L1.1, L1.2. In an embodiment, the inductors L1.1, L1.2 may be the first winding of a transformer and the inductors L2.1, L2.2 may the secondary winding of the transformer. A peak-to-peak voltage of an oscillation voltage of the LC tank 110, between nodes $V_N$ and $V_P$, may be two to three times the voltage of the power source VDD.

The oscillation frequency fosc of the oscillator circuit 100 may be related to the inductances of the inductors L1.1, L1.2, the capacitances of the capacitors C0.1, C0.2, and the capacitances of the DMOS transistors D0.1, D0.2. Therefore, the oscillation frequency fosc may be tuned by tuning the sizes of the inductors L1.1, L1.2, the capacitors C0.1, C0.2, and the DMOS transistors D0.1, D0.2 during fabrication of the LC tank 110. Ideally, the inductors L1.1, L1.2 would have substantially the same inductances, the capacitors C0.1, C0.2 would have substantially the same capacitances, and the DMOS transistors D0.1, D0.2 would be sized to have substantially identical (parasitic) capacitances. In practice, however, due to manufacturing variations and other factors, the inductances and capacitances may not be perfectly matched. In one embodiment, the DMOS transistors D0.1, D0.2 and the disabling transistors $T_D 0.1$, $T_D 0.2$ may be fabricated as n-type transistors.

Figure 2:
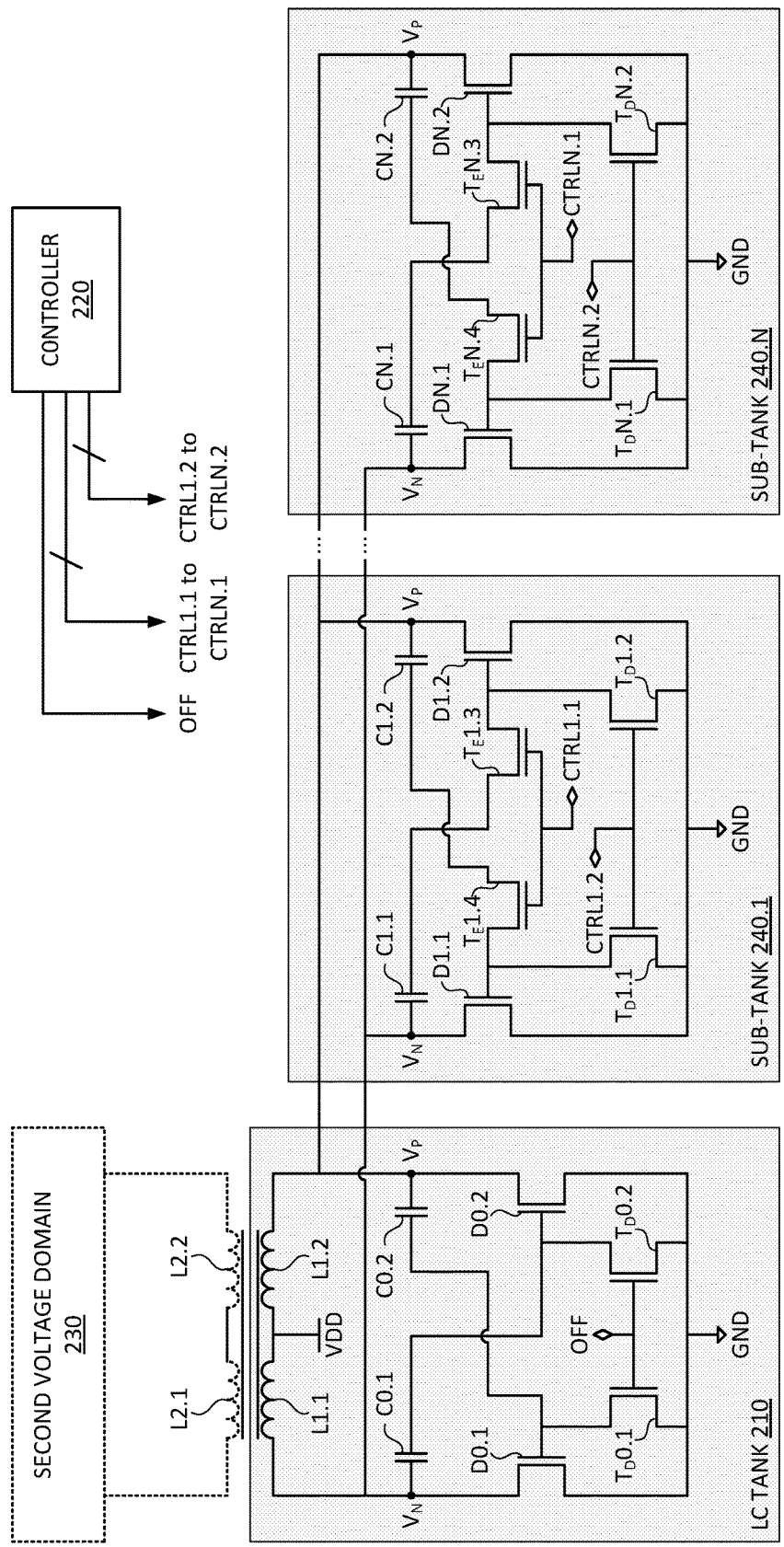
FIG. 2 illustrates an oscillator circuit according to an embodiment of the present disclosure.

FIG. 2 illustrates an oscillator circuit 200 according to an embodiment of the present disclosure. The oscillator circuit 200 may include an LC tank 210, a plurality of sub-tanks 240.1-240.N, and a controller 220. The LC tank 210 may include a pair of inductors L1.1, L1.2, a pair of capacitors C0.1, C0.2, a pair of DMOS transistors D0.1, D0.2, and a pair of disabling transistors T0.1, T0.2. Each sub-tank 240.1-240.N may include a pair of capacitors C1.1, C1.2-CN.1, CN.2, a pair of DMOS transistors D1.1, D1.2-DN.1, DN.2, a pair of disabling transistors $T_D 1.1$, $T_D 1.2$-$T_D N.1$, $T_D N.2$, and a pair of enabling transistors $T_E 1.3$, $T_E 1.4$-$T_E N.3$, $T_E N.4$.

In the LC tank 210, the pair of inductors L1.1, L1.2 may be coupled in series to form a center tap and a pair of terminals. The center tap may be coupled to a power source VDD. The pair of DMOS transistors D0.1, D0.2 may each be coupled, along a respective source-to-drain path, between a respective terminal of the pair of inductors L1.1, L1.2 and a reference voltage GND. The capacitor C0.1 may be provided in a signal path between the inductor L1.1 coupled to DMOS transistor D0.1 and a gate of the DMOS transistor D0.2. Similarly, the capacitor C0.2 may be provided in a signal path between the inductor L1.2 coupled to DMOS transistor D0.2 and a gate of the DMOS transistor D0.1. The pair of disabling transistors $T_D 0.1$, $T_D 0.2$ may have their gates coupled to a control input (OFF) and may be coupled, along their respective source-to-drain paths, between the gates of the DMOS transistors D0.1, D0.2, respectively, and the reference voltage GND.

As shown in FIG. 2, each sub-tank 240.1-240.N may be coupled in parallel with the LC tank 210 across the pair of terminals ($V_N$, $V_P$) of the inductors L1.1, L1.2. In each sub-tank 240.1-240.N, the pair of DMOS transistors D1.1, D1.2-DN.1, DN.2 may each be coupled, along a respective source-to-drain path, between a respective terminal of the pair of inductors L1.1, L1.2 and the reference voltage GND. The capacitor C1.1-CN.1 may be provided in series with the enabling transistor $T_E 1.3$-$T_E N.3$ in a signal path between the inductor L1.1 coupled to DMOS transistor D1.1-DN.1 and a gate of the DMOS transistor D1.2-DN.2. Similarly, the capacitor C1.2-CN.2 may be provided in series with the enabling transistor $T_E 1.4$-$T_E N.4$ in a signal path between the inductor L1.2 coupled to DMOS transistor D1.2-DN.2 and a gate of the DMOS transistor D1.1-DN.1. The enabling transistors $T_E 1.3$-$T_E N.3$ and $T_E 1.4$-$T_E N.4$ may have their gates coupled to respective control inputs (CTRL1.1-CTRLN.1). The pair of disabling transistors $T_D 1.1$, $T_D 1.2$-$T_D N.1$, $T_D N.2$ may have their gates coupled to another control input (CTRL1.2-CTRLN.2), and may be coupled, along their respective source-to-drain paths, between the gates of the DMOS transistors D1.1, D1.2-DN.1, DN.2, respectively, and the reference voltage GND.

The controller 220 may provide control signals CTRL1.2-CTRLN.2 (e.g., logic high) to the gates of the disabling transistors $T_D 0.1$, $T_D 0.2$-$T_D N.1$, $T_D N.2$ to activate the disabling transistors $T_D 0.1$, $T_D 0.2$-$T_D N.1$, $T_D N.2$. The control signals CTRL1.2-CTRLN.2 each may be formed by the controller as a logical OR of the control signal OFF and an inverted corresponding one of the control signals CTRL1.1-CTRLN.1. When activated, the disabling transistors $T_D 0.1$, $T_D 0.2$-$T_D N.1$, $T_D N.2$ may pull the gates of the DMOS transistors D0.1, D0.2-DN.1, DN.2 low, thereby turning off the DMOS transistors D0.1, D0.2-DN.1, DN.2 and disabling the LC tank 210 and the sub-tanks 240.1-240.N.

When the disabling transistors $T_D 0.1$, $T_D 0.2$-$T_D N.1$, $T_D N.2$ are deactivated, the DMOS transistors D0.1, D0.2 may be activated, placing the capacitors C0.1, C0.2 in series with the inductors L1.1, L1.2, respectively. Consequently, the LC tank 210 may resonate or oscillate at a resonance or oscillation frequency fosc and transmit power from the power source VDD to a second voltage domain 230 via a pair of inductors L2.1, L2.2. The inductors L2.1, L2.2 may be magnetically coupled to, but galvanically isolated from, the inductors L1.1, L1.2. The inductors L1.1, L1.2 may be the first winding of a transformer and the inductors L2.1, L2.2 may the secondary winding of the transformer.

When the disabling transistors $T_D 1.1$, $T_D 1.2$-$T_D N.1$, $T_D N.2$ are deactivated, the controller 220 may also activate one or more of the sub-tanks 240.1-240.N with control signals CTRL1.1-CTRLN.1, respectively. The controller 220 may provide the control signal CTRL1.1, . . . , CTRLN.1 (e.g., logic high) to the gates of the enabling transistors $T_E 1.3$, $T_E 1.4$-TN.3, TN.4 to enable the enabling transistors $T_E 1.3$, $T_E 1.4$-$T_E N.3$, $T_E N.4$. Consequently, the DMOS transistors D1.1, D1.2-DN.1, DN.2 may be activated, placing the capacitor C1.1-CN.1 in parallel with the capacitor C0.1, and the capacitor C1.2-CN.2 in parallel with the capacitor C0.2, thereby increasing the effective capacitance of the oscillator circuit 200 and decreasing the oscillation frequency fosc. Therefore, the oscillation frequency fosc may be set to a plurality of discrete values based on the combination/permutation of the sub-tanks 240.1-240.N activated by the controller 220. The controller 220 may be programmed to "hop" from one oscillation frequency fosc to another at a predetermined time step tstep by selectively activating the sub-tanks 240.1-240.N based on a predetermined oscillation frequency fosc sequence. The predetermined oscillation frequency fosc sequence may last for a time period T and may be repeated thereafter. The predetermined oscillation frequency fosc sequence may be in an ascending order, a descending order, a random order, or any other suitable order.

The oscillation frequency fosc, with the sub-tanks 240.1-240.N deactivated, may be tuned by tuning the sizes of the inductors L1.1, L1.2, the capacitors C0.1, C0.2, and the DMOS transistors D0.1, D0.2 during fabrication of the LC tank 210. Ideally, the inductors L1.1, L1.2 would have substantially identical inductances, the capacitors C0.1, C0.2 would have substantially identical capacitances, the DMOS transistors D0.1, D0.2 would be sized to have substantially identical capacitances. In practice, however, due to manufacturing variations and other factors, the inductances and capacitances may not be perfectly matched. In one embodiment, the DMOS transistors D0.1, D0.2-DN.1, DN.2, the disabling transistors $T_D 0.1$, $T_D 0.2$-$T_D N.1$, $T_D N.2$, and the enabling transistors $T_E 1.3$, $T_E 1.4$-$T_E N.3$, $T_E N.4$ may be fabricated as n-type transistors.

The sub-tanks 240.1-240.N may be fabricated to be identical such that, when activated, each sub-tank 240.1, . . . , 240.N may decrease the oscillation frequency fosc by a frequency step fstep. The frequency step fstep may be tuned by tuning the sizes of capacitors C1.1, C1.2-CN.1, CN.2 and the DMOS transistors D1.1, D1.2-DN.1, DN.2. Ideally, the capacitors C1.1, C1.2-CN.1, CN.2 would have substantially identical capacitances and the DMOS transistors D1.1, D1.2-DN.1, DN.2 would be sized to have substantially identical capacitances. In practice, however, due to manufacturing variations and other factors, the capacitances may not be perfectly matched. The time step tstep, the time period T, and the frequency step fstep may be set based on the application of the oscillator circuit 200 and the electromagnetic interference (EMI) requirements, for example. Further, the number of sub-tank circuits may correspond to the number of bits in the frequency hopping scheme. For example, for a 4 bit frequency hopping scheme, 15 sub-tank circuits ($2^4-1$) may be provided. The 15 sub-tank circuits and the LC tank circuit may provide 16 carriers for the 4 bit frequency hopping scheme.

Figure 3:
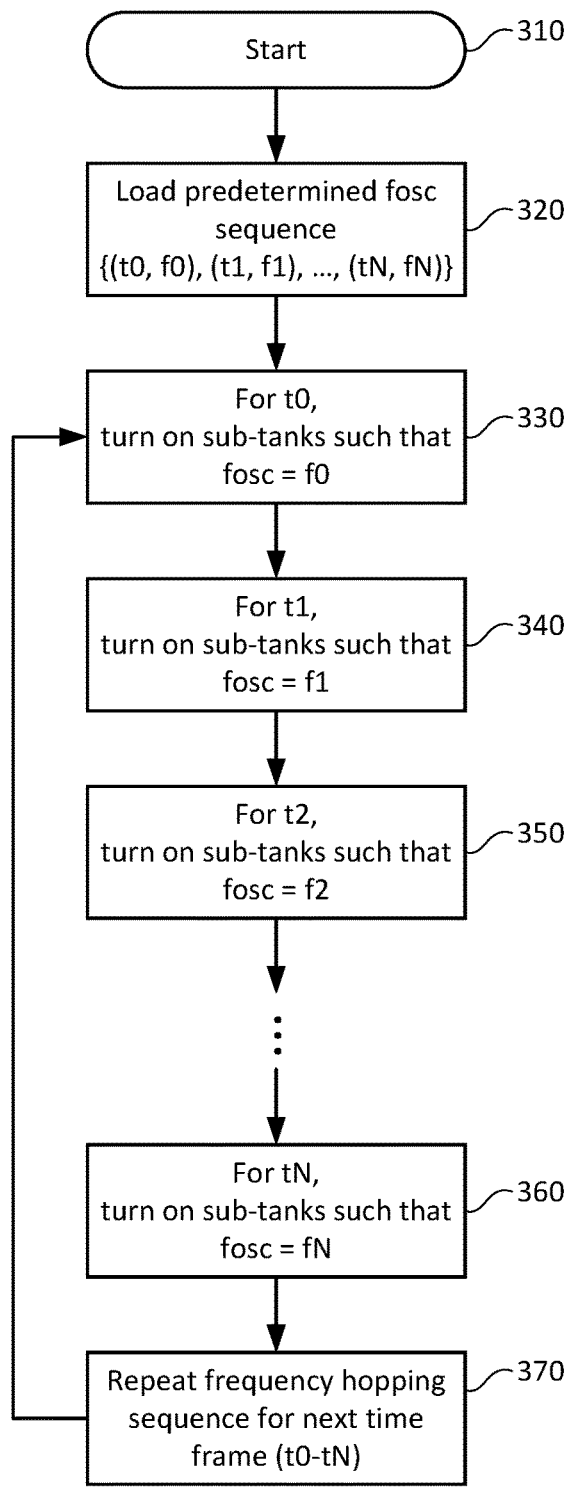
FIG. 3 illustrates a frequency hopping control method according to an embodiment of the present disclosure.

FIG. 3 illustrates a frequency "hopping" control method 300 according to an embodiment of the present disclosure. The method 300 may be performed by the oscillator circuit 200 of FIG. 2, for example. The method 300 starts at step 310 and, at step 320, a predetermined oscillation frequency fosc sequence {(t0, f0), (t1, f1), . . . , (tN, fN)} may be loaded. The predetermined oscillation frequency fosc sequence may be in an ascending order, a descending order, a random order, or any other suitable order. The predetermined oscillation frequency fosc sequence may define different oscillation frequencies at different times. At step 330, the time is t0; therefore, select sub-tanks may be activated (i.e., turned or kept on) to generate the corresponding oscillation frequency fosc=f0. At step 340, the time is t1; therefore, select sub-tanks may be activated (i.e., turned or kept on) to generate the corresponding oscillation frequency fosc=f1. At step 350, the time is t2; therefore, select sub-tanks may be activated (i.e., turned or kept on) to generate the corresponding oscillation frequency fosc=f2. The method may continue until the end of the time period T at tN, where select sub-tanks may be activated (i.e., turned or kept on) to generate the corresponding oscillation frequency fosc=fN at step 360. Thereafter, the frequency hopping steps (i.e, steps 330-360) may be repeated for the subsequent time periods T.

Figure 4:
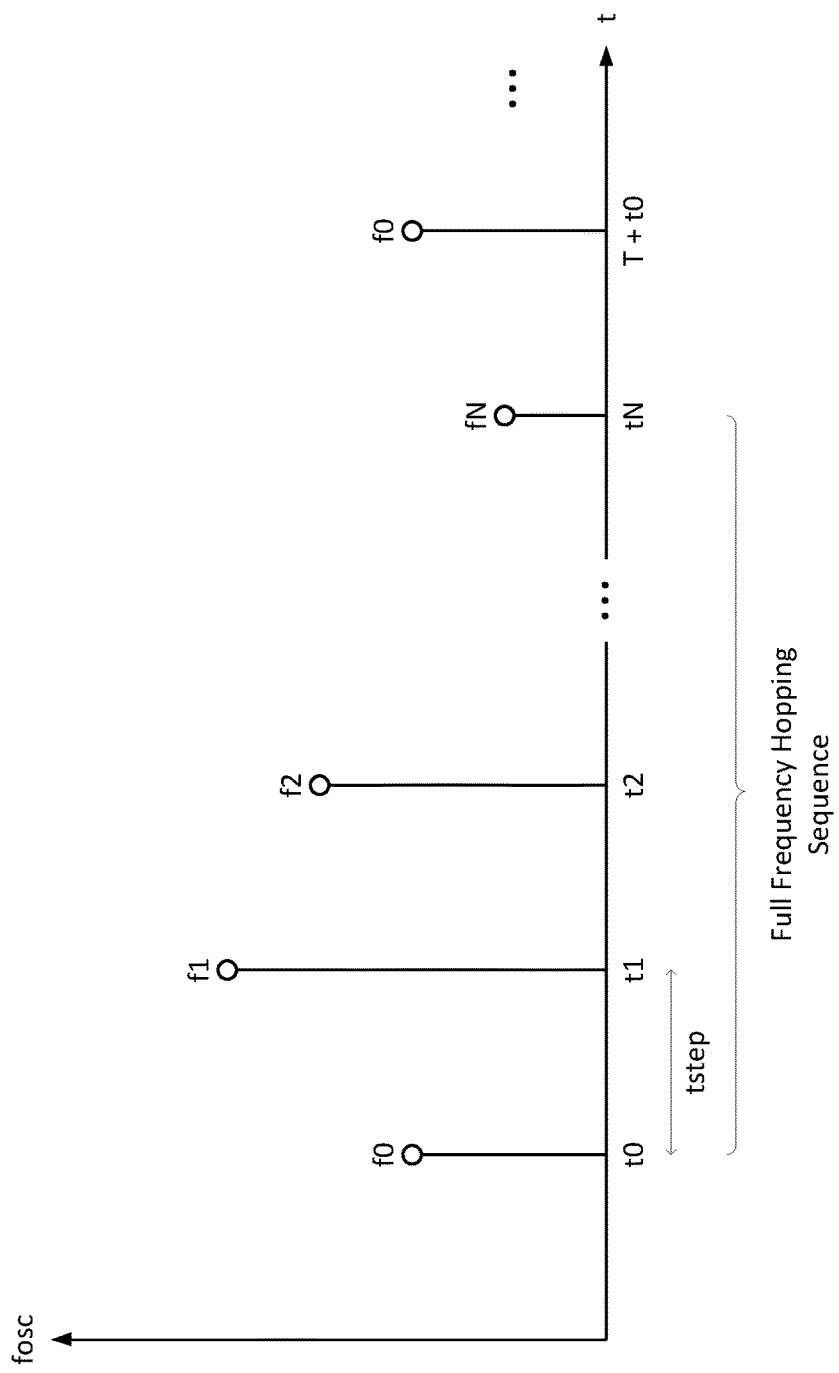
FIG. 4 illustrates an exemplary frequency hopping diagram according to an embodiment of the present disclosure.

FIG. 4 illustrates an exemplary frequency hopping diagram 400 according to an embodiment of the present disclosure. The diagram 400 illustrates how an oscillation frequency fosc of an oscillator circuit (e.g., the oscillator circuit 200) may be changed at a time step tstep to follow a predetermined oscillation frequency fosc sequence {(t0, f0), (t1, f1), . . . , (tN, fN)} over a time period T (e.g., by the controller 220 employing the method 300 of FIG. 3). The predetermined oscillation frequency fosc sequence in this example is in a random order. However, as discussed, the predetermined oscillation frequency fosc sequence may also be set to be in an ascending order, a descending order, a random order, or any other suitable order.

Figure 5:
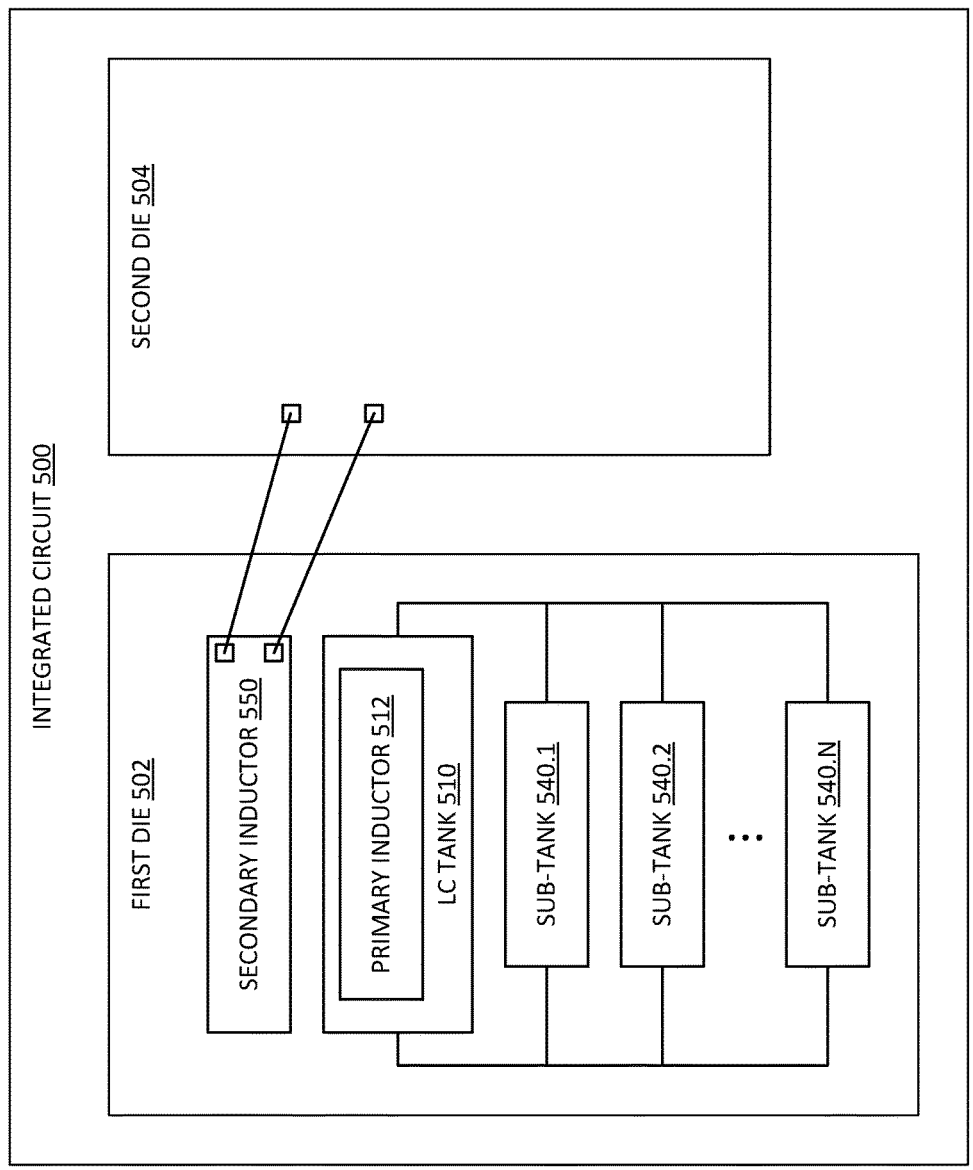
FIG. 5 illustrates a topology for an integrated circuit according to an embodiment of the present disclosure.

FIG. 5 illustrates a topology for an integrated circuit 500 according to an embodiment of the present disclosure. The integrated circuit 500 may include a first die 502 and a second die 504. The first die 502 may include an LC tank 510 and a plurality of sub-tanks 540.1-540.N connected in parallel with the LC tank 510, and a secondary inductor 550. The LC tank 510 may include a primary inductor 512 fabricated to be adjacent to the secondary inductor 550 such that the primary inductor 512 may be magnetically coupled to, but galvanically isolated from, the secondary inductor 550. The secondary inductor 550 may be coupled to the second die 540, via bonding wires for example.

The LC tank 510 and the sub-tanks 540.1-540.N may correspond respectively to the LC tank 210 and the sub-tanks 240.1-240.N of FIG. 2. The primary inductor 512 may correspond to the pair of inductors L1.1, L1.2 and the secondary inductor 550 to the pair of inductors L2.1, L2.2. Thus, with the layout shown in FIG. 5, the integrated circuit 500 may transmit power from the first die 502 (i.e., a first voltage domain) to the second die 504 (i.e., a second voltage domain via the secondary inductor 550).

Several embodiments of the disclosure are specifically illustrated and/or described herein. However, it will be appreciated that modifications and variations of the disclosure are covered by the above teachings and within the purview of the appended claims without departing from the spirit and intended scope of the disclosure. Further variations are permissible that are consistent with the principles described above.

What is claimed is:
1. An oscillator circuit, comprising:
a tank circuit including:
an inductor having a first terminal and a second terminal, the inductor including a central tap coupled to a high reference voltage,
a first pair of transistors comprising:
a first transistor coupled between the first terminal of the inductor and a ground reference voltage along a source-to-drain path of the first transistor, and
a second transistor, coupled between the second terminal of the inductor and the ground reference voltage along a source-to-drain path of the second transistor,
a second pair of transistors comprising:
a third transistor, coupled along a source-to-drain path of the third transistor between a first gate of the first transistor and the ground reference voltage, and having a third gate configured to receive a control signal, and
a fourth transistor, coupled along a source-to-drain path of the fourth transistor between a second gate of the second transistor and the ground reference voltage, and having a fourth gate configured to receive the control signal,
wherein, in a first state, the control signal, in response to being received at the third and fourth gates, activates the second pair of transistors, and wherein the activation of the second pair of transistors is configured to deactivate the first pair of transistors and disable an oscillation of the oscillator circuit, and
a first pair of capacitors comprising:
a first capacitor coupled between the first inductor terminal and the second gate of the second transistor, and
a second capacitor, coupled between the second inductor terminal and the first gate of the first transistor.

2. The oscillator circuit of claim 1, wherein, in a second state, the control signal, in response to being received at the third and fourth gates, deactivates the second pair of transistors, the deactivation of the second pair of transistors being configured to activate the first pair of transistors and enable the oscillation of the oscillator circuit.

3. The oscillator circuit of claim 1, further comprising a control circuit configured to provide the control signal to the second pair of transistors.

4. The oscillator circuit of claim 1, wherein the first pair of transistors are DMOS transistors.

5. The oscillator circuit of claim 1, wherein the first pair of capacitors have substantially equal capacitances.

6. The oscillator circuit of claim 1, wherein the first pair of transistors are substantially the same size.

7. The oscillator circuit of claim 1, further comprising at least one sub-tank circuit including:
   a third pair of transistors comprising:
   a fifth transistor coupled between the first terminal of the inductor and the ground reference voltage along a source-to-drain path of the fifth transistor, and
   a sixth transistor coupled between the second terminal of the inductor and the ground reference voltage along a source-to-drain path of the sixth transistor, and
   a second pair of capacitors comprising:
   a third capacitor coupled between the first inductor terminal and a sixth gate of the sixth transistor, and
   a fourth capacitor coupled between the second inductor terminal and a fifth gate of the fifth transistor.

8. The oscillator circuit of claim 7, wherein the at least one sub-tank circuit further comprises a fourth pair of transistors comprising a seventh and eighth transistor, the seventh transistor coupled between the fifth gate of the fifth transistor and the ground reference voltage, the eighth transistor coupled between the sixth gate of the sixth transistor and the ground reference voltage; wherein the seventh and eighth transistors have seventh and eighth gates, respectively, configured to receive a second control signal.

9. The oscillator circuit of claim 8, wherein, in a first state the second control signal, in response to being received at the seventh and eighth gates, activates the fourth pair of transistors, the activation of the fourth pair of transistors being configured to deactivate the third pair of transistors, and
   in a second state, the second control signal, in response to being received at the seventh and eighth gates, deactivates the fourth pair of transistors, the deactivation of the fourth pair of transistors being configured to activate the third pair of transistors.

10. The oscillator circuit of claim 7, wherein the at least one sub-tank circuit further comprises a fourth pair of transistors comprising a seventh and eighth transistor, the seventh transistor coupled between the third capacitor and the sixth gate of the sixth transistor along a source-to-drain path of the seventh transistor, the eighth transistor coupled between the fourth capacitor and the fifth gate of the fifth transistor along a source-to-drain path of the eighth transistor, and the fourth pair of transistors having seventh and eighth gates, respectively, configured to receive a third control signal.

11. The oscillator circuit of claim 10, wherein, in a first state, the third control signal, in response to being received at seventh and eighth gates, activates the fourth pair of transistors, the activation of the fourth pair of transistors being configured to enable oscillation of the at least one sub-tank circuit, and
   in a second state, the third control signal, in response to being received at the seventh and eighth gates, deactivates the fourth pair of transistors.

12. The oscillator circuit of claim 7, wherein the first pair and third pair of transistors are DMOS transistors and are substantially the same size.

13. The oscillator circuit of claim 1, wherein the inductor is a first winding of a transformer provided in a first circuit system, a second winding of the transformer provided in a second circuit system that is galvanically isolated from the first circuit system.

14. A method of operating a system having a first inductor-capacitor (LC) tank circuit and a second LC tank circuit in parallel with the first LC tank circuit, the method comprising:
   activating a first pair of transistors of the first LC tank circuit comprising:
      a first transistor coupled between a first terminal of an inductor and a ground reference voltage along a source-to-drain path of the first transistor, and
      a second transistor coupled between a second terminal of the inductor and the ground reference voltage along a source-to-drain path of the second transistor, the inductor including a central tap coupled to a high reference voltage,
   coupling, as a result of activating the first pair of transistors of the first LC tank circuit, the ground reference voltage to a pair of capacitors of the first LC tank circuit comprising:
      a first capacitor coupled between the first inductor terminal and a second gate of the second transistor, and
      a second capacitor coupled between the second inductor terminal and a first gate of the first transistor,
   activating a first pair of transistors of the second LC tank circuit, the first pair of transistors of the second LC tank circuit comprising:
   a third transistor coupled between the first terminal of the inductor and the ground reference voltage along a source-to-drain path of the third transistor, and
   a fourth transistor coupled between the second terminal of the inductor and the ground reference voltage along a source-to-drain path of the fourth transistor,
   wherein activating the first pair of transistors of the second LC tank circuit includes deactivating a second pair of transistors of the second LC tank circuit by applying a control signal to respective gates of the second pair of transistors of the second LC tank circuit, the second pair of transistors of the second LC tank circuit comprising a fifth and sixth transistor, the fifth transistor coupled between a first gate of the first transistor of the second LC tank circuit and the ground reference voltage, the sixth transistor coupled between a second gate of the second transistor of the second LC tank circuit and the ground reference voltage, and
   coupling, as a result of activating the first pair of transistors of the second LC tank circuit, the ground reference voltage to a pair of capacitors of the second LC tank circuit, comprising:
      a third capacitor coupled between the first inductor terminal and a fourth gate of the fourth transistor, and
      a fourth capacitor coupled between the second inductor terminal and a third gate of the third transistor.

15. The method of claim 14, wherein activating the first pair of transistors of the first LC tank circuit includes deactivating a second pair of transistors of the first LC tank circuit by providing a second control signal to respective gates of the second pair of transistors of the first LC tank circuit, the second pair of transistors of the first LC tank circuit comprising:

a seventh transistor, coupled along a source-to-drain path of the seventh transistor between the first gate of the first transistor of the first LC tank circuit and the ground reference voltage, and an eighth transistor, coupled along a source-to-drain path of the eighth transistor between the second gate of the second transistor of the first LC tank circuit and the ground reference voltage, and having an eighth gate configured to receive the second control signal.

16. A circuit, comprising:

means for activating a first pair of transistors, comprising a first transistor and a second transistor, of an inductor-capacitor (LC) tank, the first transistor coupled between a first terminal of an inductor and a ground reference voltage along a source-to-drain path of the first transistor, the second transistor coupled between a second terminal of the inductor and the ground reference voltage along a source-to-drain path of the second transistor, the inductor including a central tap coupled to a high reference voltage, wherein the means for activating the first pair of transistors of the tank circuit includes means for deactivating a second pair of transistors of the tank circuit, the second pair of transistors of the tank circuit comprising:

a third transistor, coupled along a source-to-drain path of the third transistor between a first gate of the first transistor and the ground reference voltage, and having a third gate configured to receive a control signal and, a fourth transistor, coupled along a source-to-drain path of the fourth transistor between a second gate of the second transistor and the ground reference voltage, and having a fourth gate configured to receive the control signal, and a pair of capacitors, comprising a first capacitor and a second capacitor, of the tank circuit, the first capacitor coupled between the first inductor terminal and the second gate of the second transistor, the second capacitor coupled between the second inductor terminal and the first gate of the first transistor.

17. The circuit of 25, further comprising:

means for selectively activating one or more of a plurality of sub-tank circuits connected in parallel with the LC tank circuit at a first time instance.

18. The circuit of claim 17, wherein the means for selectivity activating the one or more sub-tank circuits includes:

means for activating a first pair of transistors of the sub-tank circuit, the first pair of transistors of the sub-tank circuit comprising:

a fifth transistor coupled between the first terminal of the inductor and the ground reference voltage along a source-to-drain path of the fifth transistor, and a sixth transistor coupled between the second terminal of the inductor and the ground reference voltage along a source-to-drain path of the sixth transistor, means for coupling, as a result of activating the first pair of transistors of the sub-tank circuit, a pair of capacitors of the sub-tank circuit, comprising:

a third capacitor coupled between the first inductor terminal and a sixth gate of the sixth transistor, and a fourth capacitor coupled between the second inductor terminal and a fifth gate of the fifth transistor.

19. The circuit of claim 17, further comprising:

means for frequency hopping at a second time instance by selectively activating a different set of one or more of a plurality of sub-tank circuits.

* * * * *